(12) United States Patent
Ben Abdelaziz

(10) Patent No.: US 10,024,744 B2
(45) Date of Patent: Jul. 17, 2018

(54) CONTROL PANEL WITH FLEXIBLE PIEZOELECTRIC SENSOR FOR A VEHICLE

(71) Applicant: FAURECIA INTERIEUR INDUSTRIE, Nanterre (FR)

(72) Inventor: Omar Ben Abdelaziz, Beauvais (FR)

(73) Assignee: Faurecia Interieur Industrie, Nanterre (FR)

( * ) Notice: Subject to any disclaimer, the term of this patent is extended or adjusted under 35 U.S.C. 154(b) by 0 days.

(21) Appl. No.: 15/356,370

(22) Filed: Nov. 18, 2016

(65) Prior Publication Data

US 2017/0146414 A1   May 25, 2017

(30) Foreign Application Priority Data

Nov. 20, 2015   (FR) ..................... 15 61174

(51) Int. Cl.
| | | |
|---|---|---|
| *G01L 1/10* | (2006.01) |
| *G01L 5/22* | (2006.01) |
| *B60K 37/06* | (2006.01) |
| *H03K 17/96* | (2006.01) |
| *G01L 1/16* | (2006.01) |

(52) U.S. Cl.
CPC ............... *G01L 5/22* (2013.01); *B60K 37/06* (2013.01); *G01L 1/16* (2013.01); *H03K 17/9643* (2013.01); *B60K 2350/1024* (2013.01); *B60K 2350/1036* (2013.01); *B60K 2350/925* (2013.01)

(58) Field of Classification Search
CPC ..... G01L 1/14; G01L 1/04; G01L 1/10; G01L 5/22; G01L 3/12; G01L 3/08; G01L 5/06; G01L 3/1457; G01L 25/003; G01L 3/24; G01L 1/16; B60R 2021/01516; B60K 37/06; B60K 2350/1024; H03K 17/964; G03K 17/9643
USPC ........ 73/862.324, 862.191, 862.471, 862.08, 73/862
See application file for complete search history.

(56) References Cited

U.S. PATENT DOCUMENTS

| | | | |
|---|---|---|---|
| 2008/0092354 A1* | 4/2008 | Clingman | ............... H01L 41/25 29/25.35 |
| 2010/0141580 A1* | 6/2010 | Oh | ........................ G06F 3/0202 345/158 |
| 2010/0231528 A1 | 9/2010 | Wolfe et al. | |
| 2015/0096878 A1 | 4/2015 | Aliane et al. | |

FOREIGN PATENT DOCUMENTS

| | | |
|---|---|---|
| DE | 102011050585 A1 | 11/2012 |
| EP | 2208645 A1 | 7/2010 |
| EP | 2592201 A2 | 5/2013 |
| FR | 2908681 A1 | 5/2008 |
| WO | WO2007123404 A1 | 11/2007 |

(Continued)

OTHER PUBLICATIONS

French Search Report in French for application No. FR1561174, dated Jul. 26, 2016, 7 pages.

*Primary Examiner* — Manish S Shah
*Assistant Examiner* — Nigel Plumb
(74) *Attorney, Agent, or Firm* — Reising Ethington P.C.

(57) ABSTRACT

A control panel for a vehicle includes a flexible trim element, a rigid supporting member, a piezoelectric sensor arranged between the trim element and the supporting member, and a flexible element arranged between the piezoelectric sensor and the rigid supporting member.

12 Claims, 5 Drawing Sheets

(56) References Cited

FOREIGN PATENT DOCUMENTS

| WO | WO2009025529 | A2 | 2/2009 | |
|----|--------------|----|--------|-|
| WO | WO2012104289 | *  | 8/2012 | ........... B60R 16/005 |
| WO | WO2012104289 | A2 | 8/2012 | |
| WO | WO2015125119 | A1 | 8/2015 | |

* cited by examiner

CONTROL PANEL WITH FLEXIBLE PIEZOELECTRIC SENSOR FOR A VEHICLE

FIELD OF THE DISCLOSURE

The present invention relates to a control panel, for a vehicle.

BACKGROUND OF THE DISCLOSURE

The control panel comprises at least one control button suitable in particular for switching on or off vehicle equipment, such as the rear window defrosting system, seat heating, vehicle stability control system, warning lights, etc. The control button comprises a pressing detection element consisting of a piezoelectric sensor to change the equipment status.

The document FR2908681 A1 discloses a control panel of this type comprising:
 a trim element,
 a rigid supporting member, and
 a piezoelectric sensor arranged between the trim element and the supporting member.

An aim of the invention is that of proposing a robust control panel which can be industrialized easily and reliably, while making it possible to detect pressing ergonomically and reliably.

SUMMARY OF THE DISCLOSURE

For this purpose, according to the invention, the control panel further comprises a flexible element arranged between the piezoelectric sensor and the rigid supporting member.

By pressing on the trim element in the region of the control panel, the user induces localized deformation of the trim element which is transmitted to the piezoelectric sensor, whereas the flexible element does not need to deform the rigid supporting member to enable the deformation of the piezoelectric sensor. In other words, the flexible element makes it possible to reduce the stress applied by the user to induce a defined deformation of the piezoelectric sensor. The control panel is as such more satisfactory ergonomically and the robustness thereof is improved.

According to a further feature according to the invention, the flexible element is preferably elastically compressible.

As such, the flexible element actuates the piezoelectric sensor to a defined position.

According to a further feature according to the invention, preferably the supporting member comprises a cavity having an opening and the flexible element extends into said cavity.

As such, the deformation region is localized, which enables the user to have a better sense of the location where the user is to press.

According to an additional feature according to the invention, preferably the flexible element is restricted to the cavity.

As such, the deformation of the trim element will be restricted further and localized to the region of the piezoelectric sensor.

According to an additional feature according to the invention, preferably the flexible element is suitable for being compressed along a control direction without expanding along directions perpendicular to the control direction.

As such, the embodiment and the operation of the control panel are enhanced.

According to a further feature according to the invention, the piezoelectric sensor is preferably in the form of a layer printed on a supporting film.

As such, the positioning of the piezoelectric sensor with respect to the flexible trim element and to the rigid supporting member is easier, which simplifies the production of the control panel, particularly when it comprises multiple control buttons. The term printing denotes a deposition of material, particularly by serigraphy, material droplet jet printing or an equivalent technique.

According to an additional feature according to the invention, preferably the flexible element is in the form of a layer printed on the supporting film, the piezoelectric sensor and the flexible element being preferably arranged on either side of the supporting film.

As such, the positioning of the flexible element with respect to the piezoelectric sensor is enhanced and the production of the control panel is simplified.

According to a further additional feature according to the invention, the flexible element preferably has a thickness between 25 μm and 500 μm.

According to a further feature according to the invention, preferably the control panel comprises a plurality of piezoelectric sensors and a plurality of flexible elements, the flexible elements being separated from one another by the supporting member.

As such, the risk of pressure on the flexible trim element inducing deformation detected by two adjacent piezoelectric sensors is reduced.

In various embodiments of the control panel according to the invention, use may further be made of one and/or another of the following arrangements:
 the element is made of silicone, rubber, thermoplastic elastomer or the like;
 the supporting member is made of plastic;
 the supporting member is overmolded.

BRIEF DESCRIPTION OF THE DRAWINGS

Further features and advantages of the present invention will emerge in the following detailed description, referring to the appended drawings wherein.

DETAILED DESCRIPTION OF THE ILLUSTRATED EMBODIMENTS

Figure 1:
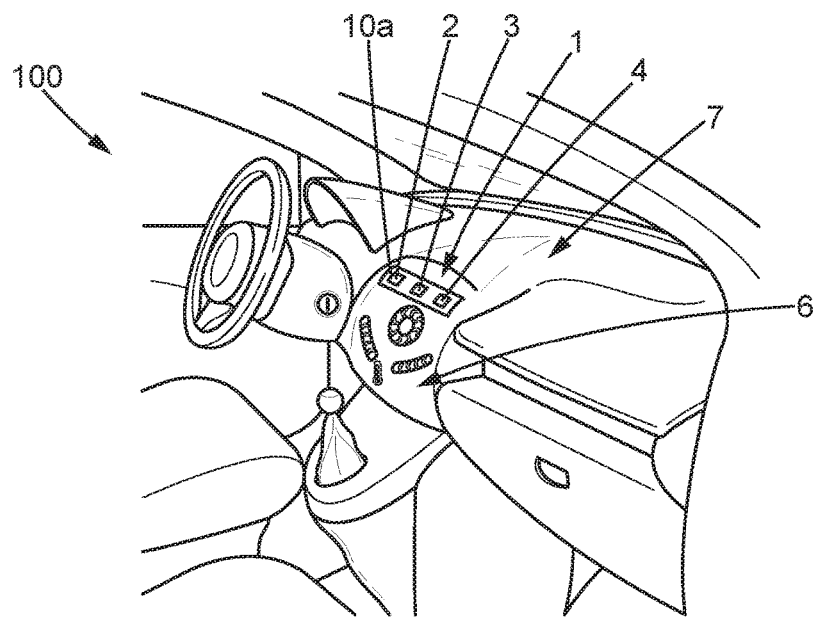
FIG. 1 represents a perspective view of a vehicle passenger compartment comprising a central console equipped with a control panel according to the invention
Figure 2:
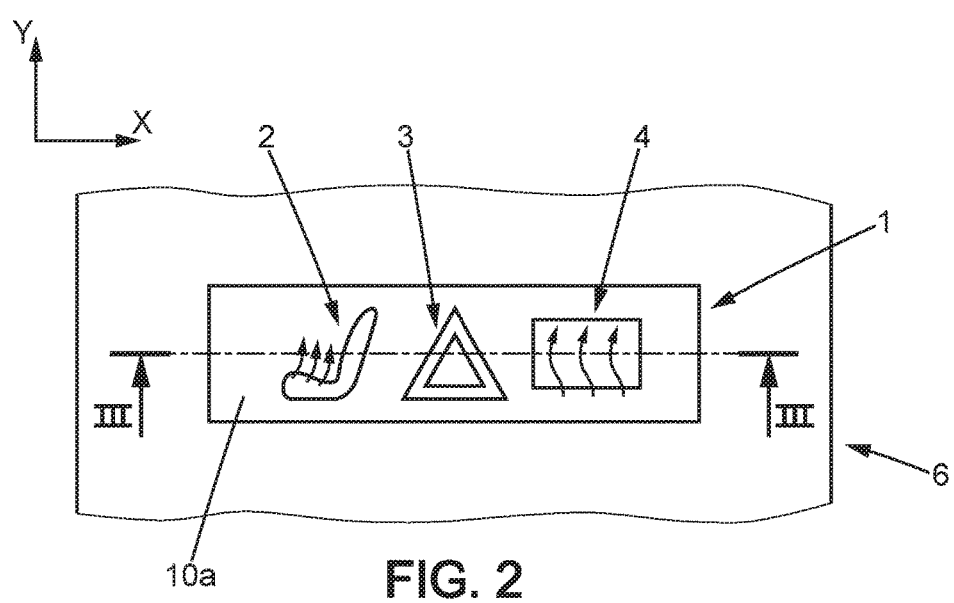
FIG. 2 represents the control panel at an enlarged scale.

FIG. 1 illustrates a motor vehicle passenger compartment 100 with a dashboard 7 equipped with a central console 6. The control console 6 comprises a control panel 1.

The control panel 1 has an outward-facing surface 10a forming a visible face. The control panel 1 comprises a plurality of control regions 2, 3, 4, three control regions in the embodiment illustrated, in succession along a longitudinal direction X. Each of the control regions 2, 3, 4 comprises a control button 8 showing a pictogram and being suitable for detecting pressure applied along a control direction Z on the outward-facing surface 10a of the control region 2, 3, 4 of the corresponding control button 8. The control direction Z is perpendicular to the longitudinal direction X. The outward-facing surface 10a extends along the longitudinal direction X and along a transverse direction Y, perpendicular to the longitudinal direction and to the control direction Z.

Figure 3:
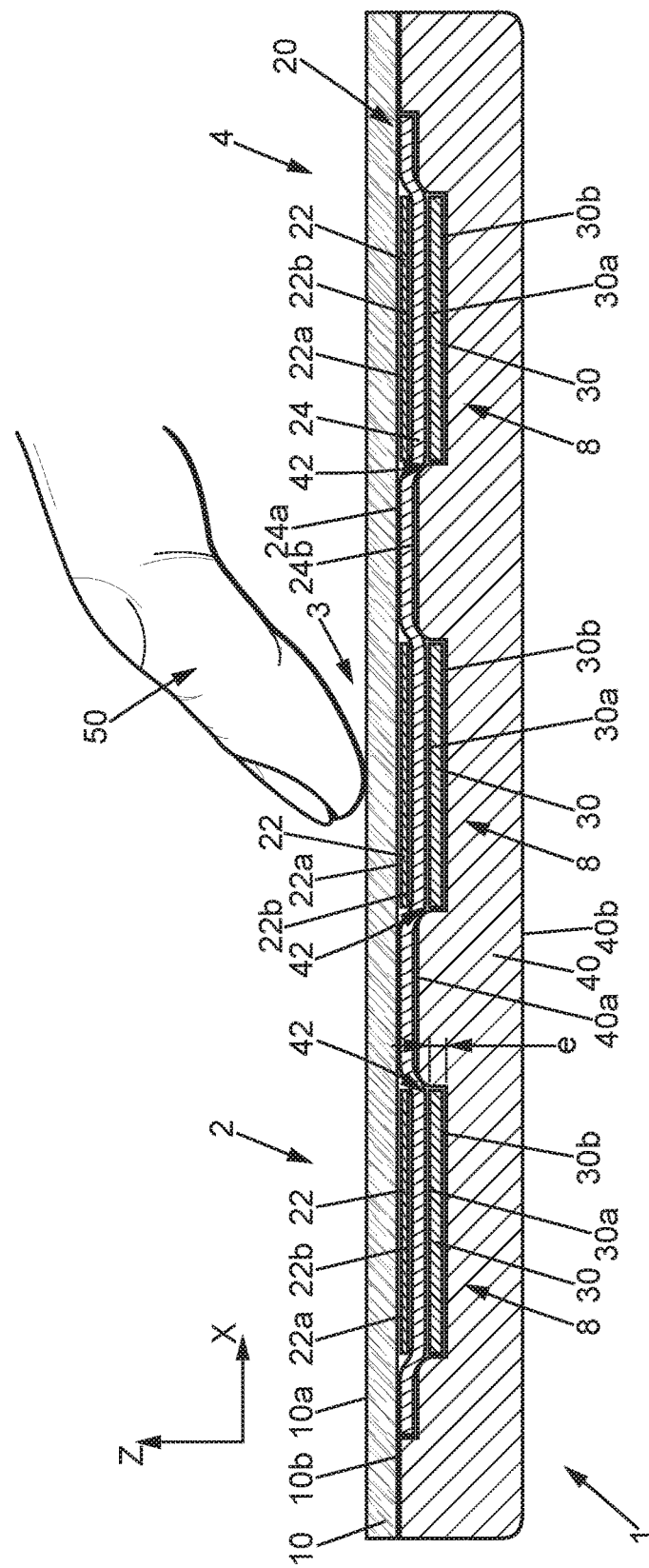
FIG. 3 is a schematic sectional representation along the line referenced in FIG. 2 of the control panel, according to a first embodiment.

As illustrated in FIG. 3, the control panel 1 essentially comprises a trim element 10, a control assembly 20, flexible elements 30 and a supporting member 40.

The trim element 10 forms a decorative layer and has the outward-facing surface 10a and a rear surface 10b, opposite the outward-facing surface 10a, both extending substantially perpendicularly to the control direction Z. Alternatively the outward-facing surface 10a may not be plane. In the embodiment illustrated, the trim element 10 comprises a plate, preferably metallic, particularly made of aluminum, of substantially constant thickness, less than 1 mm, preferably slightly less than 0.5 millimeters. Alternatively, the trim element 10 comprises a layer of carbon fiber, a layer of wood, a mineral layer for example a layer of stone, for example a layer of schist stone such as slate or mica or a layer of glass. In a further alternative embodiment, the trim element 10 comprises a layer of leather or a film of synthetic resin.

The control assembly 20 essentially comprises one piezoelectric sensor 22 per control region 2, 3, 4 and a supporting film 24 supporting the piezoelectric sensors 22.

Each piezoelectric sensor 22 has a front surface 22a facing the rear surface 10b of the trim element 10 and a rear surface 22b facing the supporting film 24. Each piezoelectric sensor 22 is mounted on the supporting film 24, preferably by printing and has a thickness of the order of 0.1 millimeter. The piezoelectric elements 22 are connected to an electrical connector by conductive tracks (not shown) also supported by the supporting film 24 and preferably produced by printing.

The supporting film 24 comprises a front surface 24a facing the piezoelectric elements and a rear surface 24b, opposite the front surface 24a. The supporting film 24 is electrically insulating, consisting of a thin layer of transparent plastic from the order of 0.1 millimeter to some tens of millimeters in thickness and is flexible.

The piezoelectric sensors 22 may also be produced according to alternative embodiments, instead of being printed on the supporting film. Alternatively, the piezoelectric sensors 22 may be produced independently from the supporting film 24, the piezoelectric sensors 22 are then advantageously of the disk or membrane piezoelectric sensor type, and are mounted on the supporting film 24, preferably by an adhesive. Furthermore, a spacer-film may be envisaged, the spacer-film comprising orifices inside which the piezoelectric sensors 22 are placed. For a more detailed description of these alternative embodiments, reference may be made to the application FR 3 031 940 A1. Furthermore, a plurality of piezoelectric sensors may be overlaid.

The thickness of the trim element 10 is adapted according to the type of material so that pressure by a user on the trim element 10 in a control region 2, 3, 4 is transmitted to the piezoelectric sensor 22. The deformation of the trim element 10 during the application of the pressure is of the order of 15 µm to 500 µm. This deformation is reversible, to the extent that the trim element 10 returns to the initial shape thereof after the pressing by the user. As such, the outward-facing surface 10a of the trim element 10 may advantageously have a smooth appearance, i.e. not having a hollow or raised region, which increases the esthetic appeal of the control panel.

The supporting member 40 comprises a front surface 40a and a rear surface 40b, opposite the front surface 40a along the control direction Z. The front surface 40a faces the rear surface 22b of the piezoelectric elements 22. The supporting member 40 has a substantially constant thickness along the control direction Z, preferably between 1 and 2 millimeters.

In the embodiment illustrated in FIG. 3, the supporting member 40 comprises cavities 42, facing each of the pressure sensors 22. The cavities 42 present are not through, such that they each have a single opening 44. The cavities 42 are preferably substantially plane and of substantially constant thickness.

The supporting member 40 is made of thermoplastic material. The supporting member 40 is produced by molding, by injection or by thermocompression. The supporting member 40 preferably consists of a mixture of polycarbonate and acrylonitrile butadiene styrene. The supporting member 40 is rigid. The term rigid denotes herein any element which cannot be deformed by merely pressing with a finger. The rigidity of the supporting member 40 is given either by the nature of the constituent material of the supporting member, or by the structural features thereof such as the thickness thereof, shape thereof, any reinforcing elements (ribs) thereof.

The flexible elements 30 are arranged facing the piezoelectric sensors 22. More specifically, the flexible elements 30 are arranged in the cavities 42 and have a front surface 30a facing the rear surface 22a of a piezoelectric sensor 22 and a rear surface facing the front surface 40a of the supporting member 40. In the first embodiment illustrated in FIG. 3, the supporting film 24 is arranged between the piezoelectric sensors 22 and the flexible elements 30. In the embodiment illustrated, the flexible elements 30 are advantageously printed on the supporting film 24.

Figure 4:
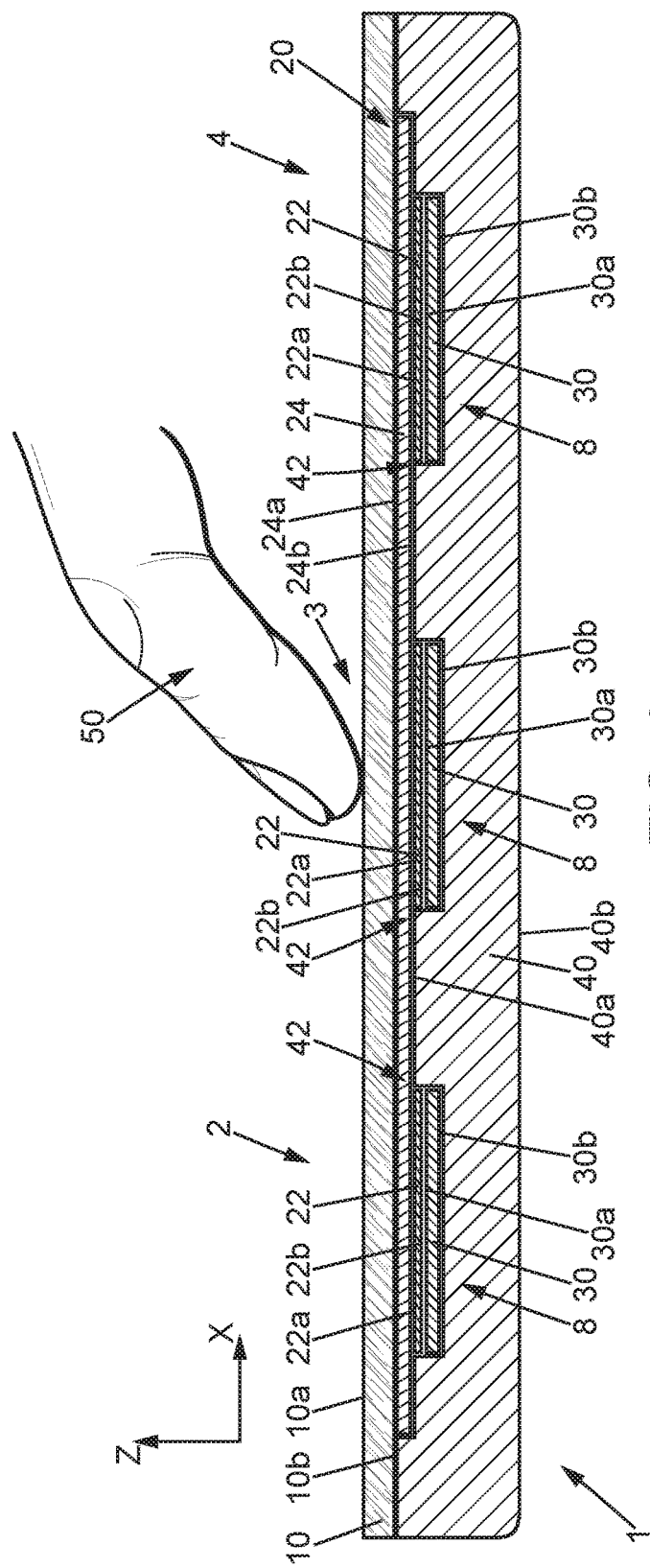
FIG. 4 is a schematic sectional representation along the line referenced in FIG. 2 of the control panel, according to a second embodiment.

Alternatively, in the second embodiment illustrated in FIG. 4, the supporting film 24 is arranged between the trim element 10 and the piezoelectric sensors 22, the flexible elements 30 being preferably printed on the piezoelectric sensors 22.

Figure 5:
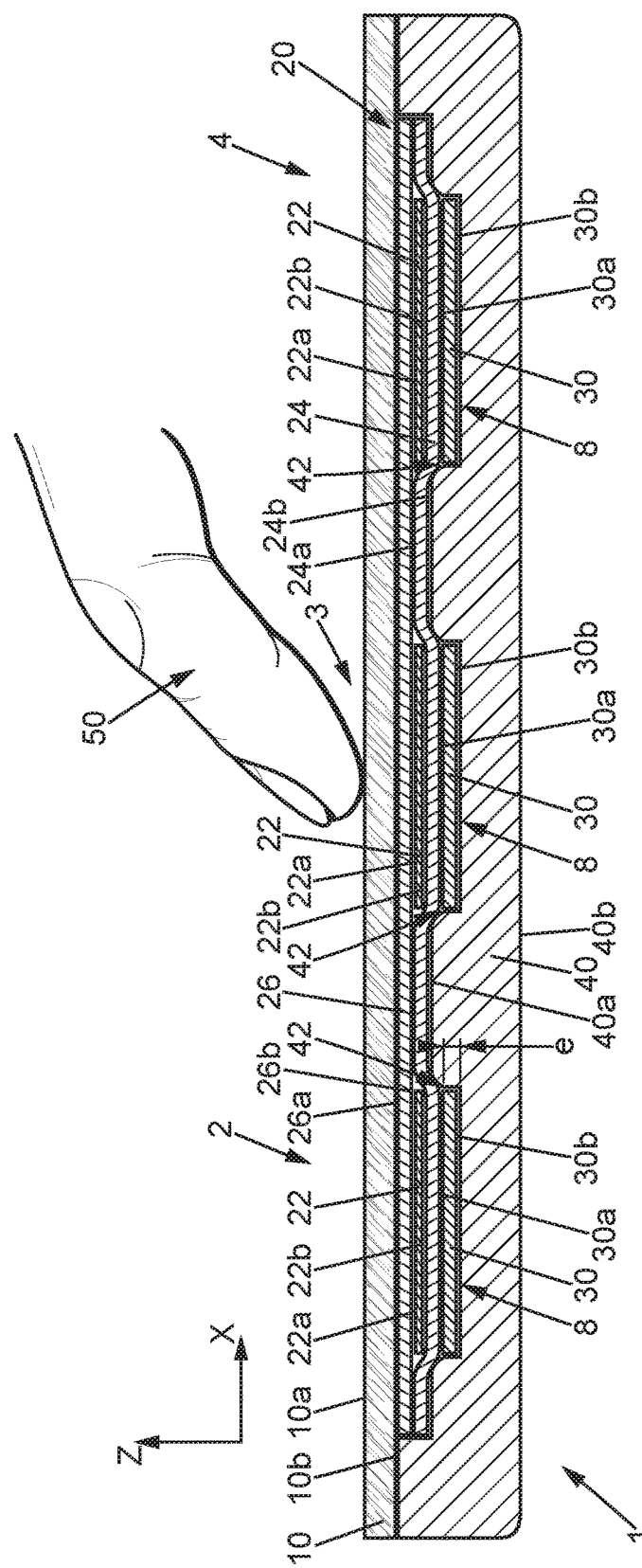
FIG. 5 is a schematic sectional representation along the line referenced in FIG. 2 of the control panel, according to a third embodiment.

According to a third embodiment illustrated in FIG. 5, the supporting film 24 is arranged between the trim element 10 and the piezoelectric sensors 22, a second supporting film 26 is arranged between the piezoelectric sensors 22 and the flexible elements 30. Preferably, on one hand, the piezoelectric sensors 22 are printed on the supporting film 24, on the other, the flexible elements 30 are printed on the second supporting film 26, and then the supporting film 24 with the piezoelectric sensors 22 is arranged between the trim element 10 and the second supporting film 26 with the printed flexible elements 30.

The flexible elements 30 have a substantially constant thickness e and are substantially plane, in the embodiment illustrated. The front surface 30a of the flexible elements is substantially flush with the opening 44 of the cavity, such that the flexible elements 30 are restricted to the cavities 42 and that, apart from the regions of the supporting film 24 where the flexible elements 30 are present, the supporting film 24 is substantially in contact with the supporting member 40. As such, along the longitudinal direction X along which the control buttons 8 are arranged, the flexible elements are separated from one another by the supporting member 40. The risk of the piezoelectric sensor 22 of a control region 2, 3, 4 detecting deformation in an adjacent region is consequently reduced.

The thickness e of the flexible elements is preferably between 25 μm and 500 μm.

The flexible elements 30 are preferably elastically deformable, so as to actuate the pressure sensors 22 to a defined position which consists, in the embodiment illustrated, of holding the front surface 22a of the pressure sensors 22 bearing against the rear surface 10b of the trim element 10.

The flexible elements 30 are advantageously made of silicone, rubber, thermoplastic elastomer or equivalent. They are preferably suitable for being deformed by at least a quarter of the thickness thereof when subjected to a force of 10 N on the overall front surface 30a thereof.

Moreover, the flexible elements 30 are preferably suitable for being compressed along the control direction Z, without expanding perpendicularly to the control direction Z. For this purpose, the flexible elements 30 are preferably of the lacunose type, such as a foam or a sponge.

As illustrated in FIG. 3, when a user 50 presses with his/her finger onto the outward-facing surface 10a in one of the control regions 2, 3, 4, the trim element 10 is subject to the pressure applied by the user and is deformed slightly. The pressure is transmitted by deformation via the piezoelectric sensor 22, the supporting film 24 and the flexible element 30. The piezoelectric sensor 22 detects this deformation and transmits an electric signal to an electronic control unit (not shown), intended to control vehicle equipment, via conductive tracks. The flexible element 30 "absorbs" this deformation by being compressed along the deformation direction Z. The supporting member 40 is not substantially deformed.

The piezoelectric sensors 22 advantageously have a diameter of the order of 15 millimeters perpendicularly to the control direction Z. In the embodiment illustrated, the flexible elements 30 have substantially the same size as the piezoelectric sensors 22 perpendicularly to the control direction Z. Preferably, perpendicularly to the control direction Z, the flexible elements 30 present are at least equal in size to that of the piezoelectric sensors 22. In one alternative embodiment, the flexible elements 30 may be greater in size to that of the piezoelectric sensors 22, by between 25% and 100% along at least one of the longitudinal X and transverse Y directions, in order to enable the flexible elements to yield along these directions, when the flexible elements 30 are made of a material not suitable for mere compression.

The trim element 10 after having been optionally thermoformed is attached by the rear surface 10b thereof to the front surface of the control assembly 20, preferably by bonding.

Figure 6:
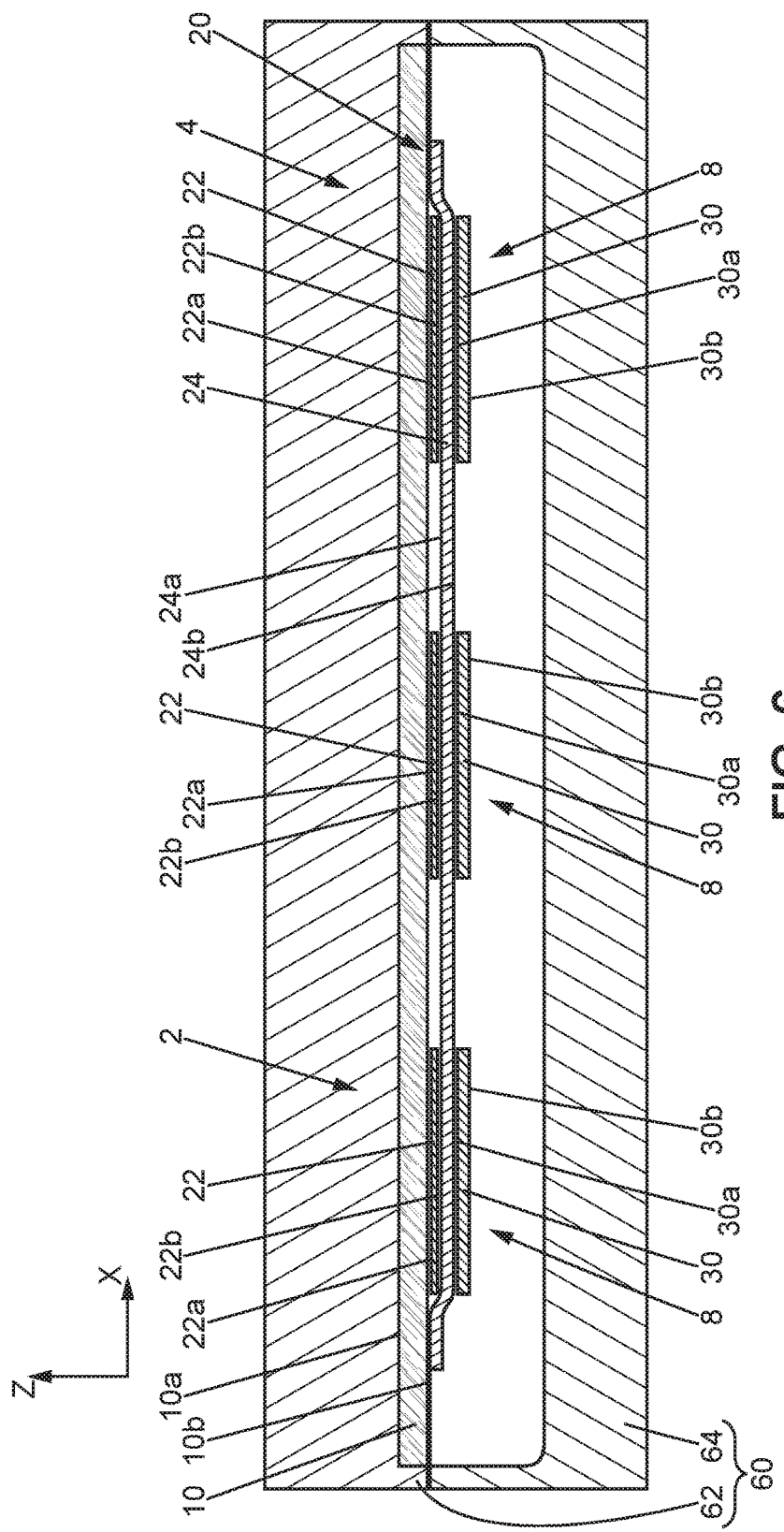
FIG. 6 illustrates a step for producing the control panel according to the invention.

As illustrated in FIG. 6, the trim element 10 and the control assembly 20 are subsequently preferably arranged in a cavity formed between a first part 62 and a second part 64 of a mold 60. The supporting member 40 is then overmolded so as to adhere to the control assembly 20 and to the rear surface 10b of the trim element 10, the supporting member 40 then coming into contact with the flexible elements 30 such that the cavities 42 closely mold the shape of the flexible elements 30 with the exception of the side of the front surface 30a.

Alternatively (not shown), the supporting member 40 may be produced independently from the trim element 10 and the control assembly 20, preferably by thermoforming, and then be mounted by assembly or bonding to the trim element 10.

The invention claimed is:

1. Control panel, for a vehicle, said control panel comprising:
a trim element,
a rigid supporting member,
a piezoelectric sensor arranged between the trim element and the supporting member, and a flexible element arranged between the piezoelectric sensor and the rigid supporting member, wherein:
the piezoelectric sensor is in the form of a layer printed on a supporting film,
the flexible element is in the form of a layer printed on the supporting film, and
the piezoelectric sensor and the flexible element are arranged on either side of the supporting film.

2. Control panel according to claim 1 wherein the flexible element is elastically compressible.

3. Control panel according to claim 1 wherein the supporting member comprises a cavity having an opening and the flexible element extends into said cavity.

4. Control panel according to claim 3 wherein the flexible element is restricted to the cavity.

5. Control panel according to claim 4 wherein the flexible element has a thickness between 25 μm and 500 μm.

6. Control panel according to claim 1 wherein the flexible element is of the lacunose type.

7. Control panel, for a vehicle, said control panel comprising:
a trim element,
a rigid supporting member comprising a cavity having an opening,
a piezoelectric sensor arranged between the trim element and the supporting member, and
a flexible element arranged between the piezoelectric sensor and the rigid supporting member,
wherein the supporting member is molded over the flexible element, the flexible element is restricted to the cavity, and the cavity closely molds the shape of the flexible element.

8. Control panel according to claim 7 wherein the flexible element is suitable for being compressed along a control direction without expanding along directions perpendicular to the control direction.

9. Control panel according to claim 7 comprising a plurality of piezoelectric sensors and a plurality of flexible elements, the flexible elements being separated from one another by the supporting member.

10. Control panel according to claim 7 wherein the flexible element is made of silicone, rubber, thermoplastic elastomer or the like.

11. Control panel according to claim 7 wherein the flexible element is of the lacunose type.

12. Control panel, for a vehicle, said control panel comprising:
a trim element,
a rigid supporting member,
a piezoelectric sensor arranged between the trim element and the supporting member, and
a flexible element arranged between the piezoelectric sensor and the rigid supporting member,
wherein the supporting member is molded over the trim element, the supporting member adhering to the trim element.

* * * * *